United States Patent
Bleeker

(10) Patent No.: US 7,154,587 B2
(45) Date of Patent: Dec. 26, 2006

(54) SPATIAL LIGHT MODULATOR, LITHOGRAPHIC APPARATUS AND DEVICE MANUFACTURING METHOD

(75) Inventor: Arno Jan Bleeker, Westerhoven (NL)

(73) Assignee: ASML Netherlands B.V, Veldhoven (NL)

(*) Notice: Subject to any disclaimer, the term of this patent is extended or adjusted under 35 U.S.C. 154(b) by 75 days.

(21) Appl. No.: 10/875,616

(22) Filed: Jun. 25, 2004

(65) Prior Publication Data
US 2005/0024613 A1    Feb. 3, 2005

(30) Foreign Application Priority Data
Jun. 30, 2003    (EP) .............................. 03254140.1

(51) Int. Cl.
G03B 27/42    (2006.01)
G03B 27/54    (2006.01)

(52) U.S. Cl. .......................................... 355/67; 355/53
(58) Field of Classification Search ................. 355/53, 355/55, 67, 71; 430/5, 20, 30; 359/290–291
See application file for complete search history.

(56) References Cited

U.S. PATENT DOCUMENTS

| | | | |
|---|---|---|---|
| 5,159,225 A * | 10/1992 | Um ............................ | 310/328 |
| 5,229,872 A | 7/1993 | Mumola | |
| 5,296,891 A | 3/1994 | Vogt et al. | |
| 5,339,390 A * | 8/1994 | Robertson et al. .......... | 715/782 |
| 5,500,736 A | 3/1996 | Koitabashi et al. | |
| 5,523,193 A | 6/1996 | Nelson | |
| 5,530,482 A | 6/1996 | Gove et al. | |
| 5,537,234 A * | 7/1996 | Williams et al. ............... | 349/42 |
| 5,552,923 A * | 9/1996 | Min ........................... | 359/224 |
| 5,579,147 A | 11/1996 | Mori et al. | |
| 5,677,703 A | 10/1997 | Bhuva et al. | |
| 5,808,797 A | 9/1998 | Bloom et al. | |
| 5,982,553 A | 11/1999 | Bloom et al. | |
| 6,133,986 A | 10/2000 | Johnson | |
| 6,177,980 B1 | 1/2001 | Johnson | |
| 6,285,488 B1 * | 9/2001 | Sandstrom ................... | 359/290 |
| 6,348,991 B1 * | 2/2002 | Smith et al. ................. | 359/321 |
| 6,356,340 B1 * | 3/2002 | Spence ........................ | 355/53 |
| 6,388,798 B1 | 5/2002 | Smith et al. | |
| 6,687,041 B1 | 2/2004 | Sandstrom | |
| 6,687,428 B1 * | 2/2004 | Huber et al. .................. | 385/17 |
| 6,747,783 B1 | 6/2004 | Sandstrom | |
| 6,795,169 B1 | 9/2004 | Tanaka et al. | |
| 6,806,897 B1 | 10/2004 | Kataoka et al. | |

(Continued)

FOREIGN PATENT DOCUMENTS

WO    WO98/33096    7/1998

(Continued)

OTHER PUBLICATIONS

Copy of European Search Report for European Appl. 03253414.0 mailed Dec. 12, 2003.

*Primary Examiner*—Henry Hung Nguyen
(74) *Attorney, Agent, or Firm*—Sterne, Kessler, Goldstein & Fox P.L.L.C.

(57) ABSTRACT

A spatial light modulator used to pattern a radiation beam comprises an array of pixels disposed on a support. Each pixel has a light modulating element for modulating the radiation beam and a control circuit that positions the light modulating elements according to a desired pattern. The control circuit is disposed on the opposite side of the support than the light modulating elements. The control circuit comprises at least one of a digital to analog converter, an analog to digital converter, an optical fiber input, and a processor.

9 Claims, 2 Drawing Sheets

U.S. PATENT DOCUMENTS

| | | |
|---|---|---|
| 6,811,953 B1 | 11/2004 | Hatada et al. |
| 2002/0153362 A1 | 10/2002 | Sandstrom et al. |
| 2004/0041104 A1 | 3/2004 | Liebregts et al. |
| 2004/0130561 A1 | 7/2004 | Jain |
| 2005/0007572 A1 | 1/2005 | George et al. |

FOREIGN PATENT DOCUMENTS

| | | |
|---|---|---|
| WO | WO98/38597 | 9/1998 |

* cited by examiner

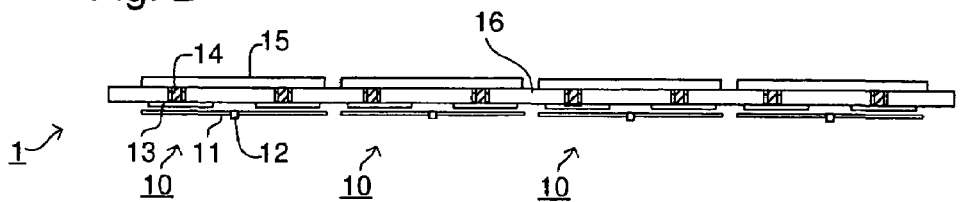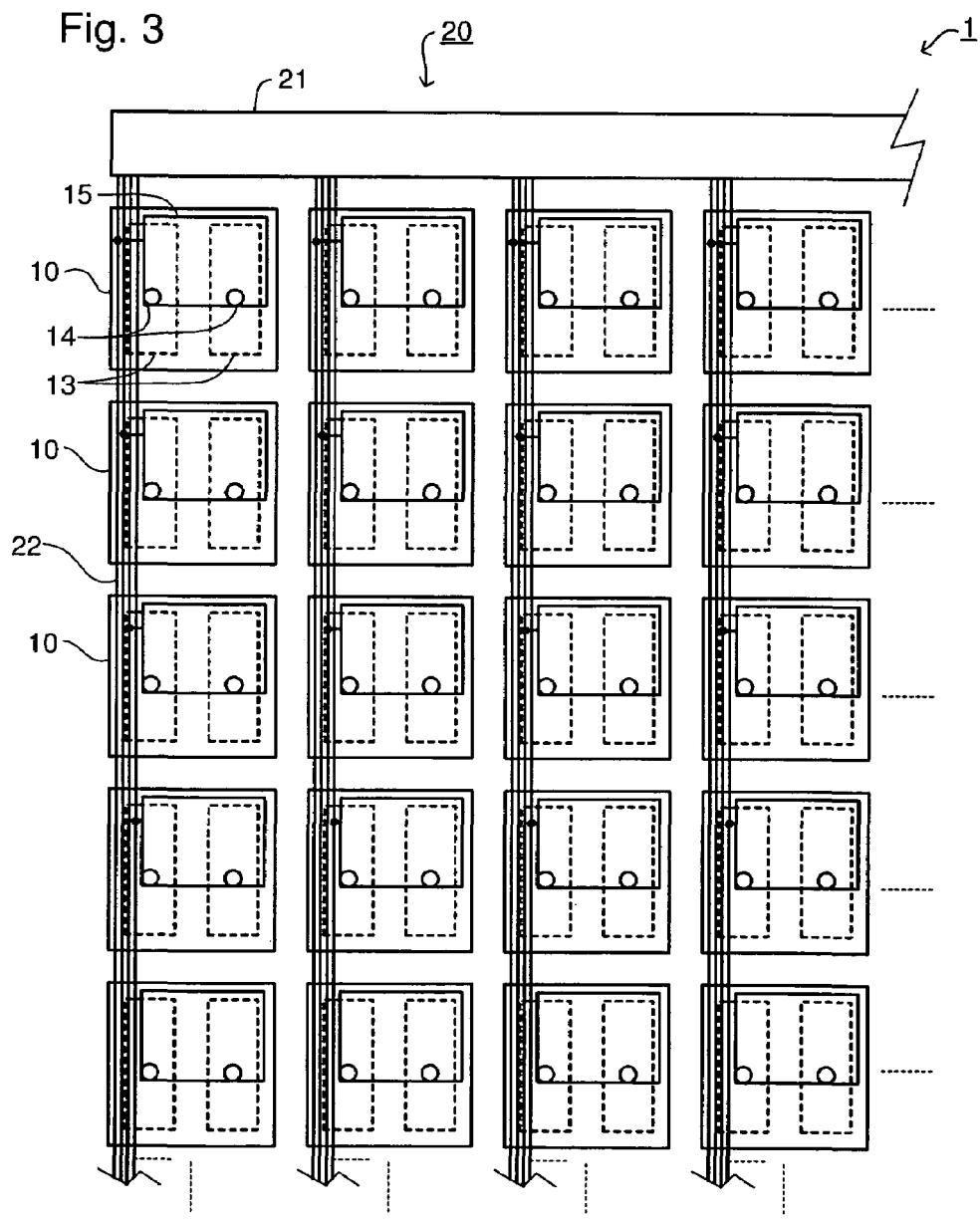

SPATIAL LIGHT MODULATOR, LITHOGRAPHIC APPARATUS AND DEVICE MANUFACTURING METHOD

BACKGROUND OF THE INVENTION

1. Field of the Invention

The present invention relates to a calibration method for a lithographic apparatus and to a device manufacturing method.

2. Related Art

A lithographic apparatus is a machine that applies a desired pattern onto a target portion of a substrate. Lithographic apparatus can be used, for example, in the manufacture of integrated circuits (ICs), flat panel displays and other devices involving fine structures. In a conventional lithographic apparatus, a patterning means, which is alternatively referred to as a mask or a reticle, may be used to generate a circuit pattern corresponding to an individual layer of the IC (or other device), and this pattern can be imaged onto a target portion (e.g., comprising part of one or several dies) on a substrate (e.g., a silicon wafer or glass plate) that has a layer of radiation-sensitive material (resist). Instead of a mask, the patterning means may comprise an array of individually controllable elements that generate the circuit pattern on an impinging light beam.

In general, a single substrate will contain a network of adjacent target portions that are successively exposed. Lithographic apparatus include steppers, in which each target portion is irradiated by exposing an entire pattern onto the target portion in one pass, and scanners, in which each target portion is irradiated by scanning the pattern through the projection beam in a given direction (the "scanning"-direction), while synchronously scanning the substrate parallel or anti-parallel to this direction.

A significant problem in a lithographic apparatus using an array of individually controllable elements is uploading the data necessary to set the pixels of the array of individually controllable elements. To achieve throughputs and resolutions comparable with mask-based lithographic apparatus, maskless systems typically use data transfer rates of 80 terabits per second, or more. A typical array of individually controllable elements may have pixels of about 8 µm×8 µm with an array of pixels of about 1000×4000 pixels. Multiple communication lines need to be operated in parallel to achieve the data rates desired. Switching rates will be high, and thus there is a large heat dissipation in a small device. Also, the necessary addressing circuitry is complex and difficult to fit in a small space.

For example, U.S. Pat. No. 6,388,798 B2 ("the '798 patent"), which is incorporated by reference herein in its entirety, discloses a system using a spatial light modulator, specifically a liquid crystal light valve (LCLV), on one side of a substrate and a microprocessor on the other side of the substrate. Electrical connections between the microprocessor and spatial light modulator are made by metal-lined vias extending through the substrate. The resulting structure is shown in FIG. 4 of the '798 patent. The vias are connected on the microprocessor side of the support to the metal one metallization layer (M-one) and the microprocessor is built on top of that. Bumps are used to connect the microprocessor to a PCB.

The spatial light modulator disclosed in the '798 patent is intended for use in portable or handheld devices and home entertainment apparatus. The integration of the microprocessor on the same substrate makes the device more compact, which is its principal advantage, and also enables ancillary optics in home entertainment devices to be made smaller as well. The '798 patent does not consider arrangements for addressing the pixels of the spatial light modulator, and proposes no means of improving data transfer rates.

Therefore, what is needed is a spatial light modulator suitable for use in a lithographic projection apparatus that is able to be programmed at high data transfer rates.

SUMMARY OF THE INVENTION

An embodiment of the present invention provides a spatial light modulator comprising an array of pixels disposed on a substrate, each pixel having a light modulating element for modulating an incident radiation beam and control circuitry for setting the light modulating elements according to a desired pattern and disposed on the opposite side of the substrate than the light modulating elements. The control circuitry comprises at least one of a digital to analog converter, an analog to digital converter, an optical fiber input, and a plurality of processors.

In this embodiment, the provision of additional circuitry on the backside of the substrate allows additional computational power and complexity to be provided on the spatial light modulator. This can be used to limit the number of (input/output) I/O connections to the data path, to allow either digital or analog inputs, and/or to allow compressed data delivery, with decompression occurring at the spatial light modulator. The provision of additional circuitry on the backside of the substrate also can provide a way of reducing the impact of the enormous data transfer rates that are necessary if the spatial light modulator is to perform at wafer throughput levels comparable to mask-based lithography systems. More generally, the provision of additional circuitry on the backside of the substrate also can provide for increased spatial light modulator image refresh rates, which may otherwise be limited by data transfer bottlenecks en route to the spatial light modulator.

It is also possible to enable the control circuitry to calibrate each pixel of the array.

Another embodiment of the present invention provides a lithographic projection apparatus comprising a radiation system for providing a projection beam of radiation, an array of individually controllable elements for patterning the projection beam according to a desired pattern, a substrate table for holding a substrate, and a projection system for projecting the patterned beam onto a target portion of the substrate. In this embodiment, the array of individually controllable elements is a spatial light modulator as described above.

A further embodiment of the present invention provides a device manufacturing method comprising the steps of providing a substrate, providing a projection beam of radiation using a radiation system, using an array of individually controllable elements to pattern the projection beam, and projecting the patterned beam of radiation onto a target portion of the substrate. In this embodiment, a spatial light modulator as described above is used as the array of individually controllable elements.

Further embodiments, features, and advantages of the present invention, as well as the structure and operation of the various embodiments of the present invention are described in detail below with reference to accompanying drawings.

BRIEF DESCRIPTION OF THE FIGURES

The accompanying drawings, which are incorporated herein and form a part of the specification, illustrate various embodiments of the present invention and, together with the description, further serve to explain the principles of the invention and to enable a person skilled in the pertinent art to make and use the invention.

FIG. 2 is a side view of a spatial light modulator, according to one embodiment of the invention.

FIG. 3 is a plan view of a back side of the spatial light modulator of FIG. 2.

In the Figures, corresponding reference symbols indicate corresponding parts.

DETAILED DESCRIPTION OF THE DETAILED EMBODIMENT(S)

Terminology

Figure 1:
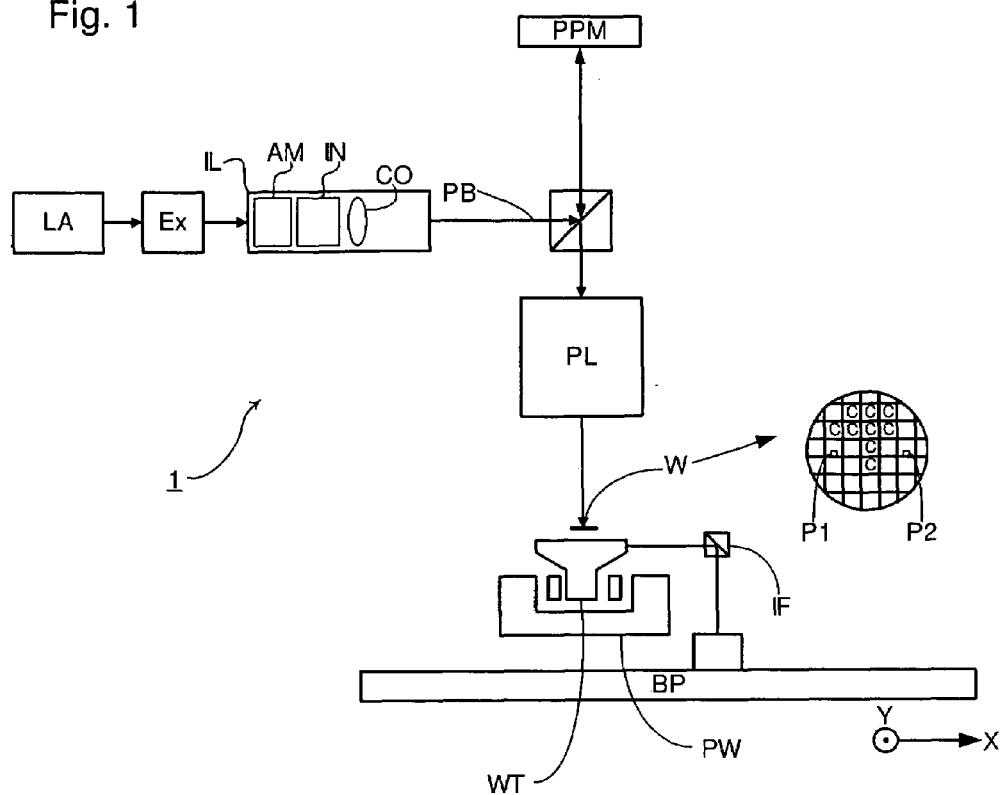
FIG. 1 depicts a lithographic projection apparatus, according to one embodiment of the invention.

The term "array of individually controllable elements" as here employed should be broadly interpreted as referring to any means that can be used to endow an incoming radiation beam with a patterned cross-section, so that a desired pattern can be created in a target portion of the substrate; the terms "light valve" and "Spatial Light Modulator" (SLM) can also be used in this context. Examples of such patterning means include, but are not limited to, a programmable mirror array and a programmable liquid crystal device (LCD) array.

A programmable mirror array may comprise a matrix-addressable surface having a viscoelastic control layer and a reflective surface. The basic principle behind such an apparatus is that addressed areas of the reflective surface reflect incident light as diffracted light, whereas unaddressed areas reflect incident light as undiffracted light. Using an appropriate spatial filter, the undiffracted light can be filtered out of the reflected beam, leaving only the diffracted light to reach the substrate. In this manner, the beam becomes patterned according to the addressing pattern of the matrix-addressable surface.

It will be appreciated that, as an alternative, the filter may filter out the diffracted light, leaving the undiffracted light to reach the substrate.

An array of diffractive optical MEMS devices can also be used in a corresponding manner. Each diffractive optical MEMS device is comprised of a plurality of reflective ribbons that can be deformed relative to one another to form a grating that reflects incident light as diffracted light.

A further alternative embodiment of a programmable mirror array employs a matrix arrangement of tiny mirrors, each of which can be individually tilted about an axis by applying a suitable localized electric field, or by employing piezoelectric actuation means. Once again, the mirrors are matrix-addressable, such that addressed mirrors will reflect an incoming radiation beam in a different direction to unaddressed mirrors. In this manner, the reflected beam is patterned according to the addressing pattern of the matrix-addressable mirrors.

The matrix addressing can be performed using suitable electronic means. In the examples described above, the array of individually controllable elements can comprise one or more programmable mirror arrays. More information on mirror arrays can be found, for example, from U.S. Pat. Nos. 5,296,891 and 5,523,193, and PCT patent applications WO 98/38597 and WO 98/33096, which are incorporated herein by reference.

An example programmable LCD array is shown in U.S. Pat. No. 5,229,872, which is incorporated herein by reference.

It should be appreciated that where pre-biasing of features, optical proximity correction features, phase variation techniques, and multiple exposure techniques are used, for example, the pattern "displayed" on the array of individually controllable elements may differ substantially from the pattern eventually transferred to a layer of or on the substrate. Similarly, the pattern eventually generated on the substrate may not correspond to the pattern formed at any one instant on the array of individually controllable elements. This may be the case in an arrangement in which the eventual pattern formed on each part of the substrate is built up over a given period of time or a given number of exposures, during which the pattern on the array of individually controllable elements and/or the relative position of the substrate changes.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat panel displays, thin-film magnetic heads, etc. The skilled artisan will appreciate that, in the context of such alternative applications, any use of the terms "wafer" or "die" herein may be considered as synonymous with the more general terms "substrate" or "target portion," respectively.

The substrate referred to herein may be processed, before or after exposure, in for example a track (a tool that typically applies a layer of resist to a substrate and develops the exposed resist) or a metrology or inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

The terms "radiation" and "beam" used herein encompass all types of electromagnetic radiation, including, but not necessarily limited to, ultraviolet (UV) radiation (e.g. having a wavelength of 408, 355, 365, 248, 193, 157 or 126 nm) and extreme ultra-violet (EUV) radiation (e.g. having a wavelength in the range of 5–20 run), as well as particle beams, such as ion beams or electron beams.

The term "projection system" used herein should be broadly interpreted as encompassing various types of projection systems, including refractive optical systems, reflective optical systems, and catadioptric optical systems, as appropriate for example for the exposure radiation being used, or for other factors such as the use of an immersion fluid or the use of a vacuum. Any use of the term "lens" herein may be considered as synonymous with the more general term "projection system."

The illumination system may also encompass various types of optical components, including refractive, reflective, and catadioptric optical components for directing, shaping, or controlling the projection beam of radiation, and such components may also be referred to below, collectively or singularly, as a "lens".

The lithographic apparatus may be of a type having two (dual stage) or more substrate tables. In such "multiple stage" machines the additional tables may be used in parallel, or preparatory steps may be carried out on one or more tables while one or more other tables are being used for exposure.

The lithographic apparatus may also be of a type wherein the substrate is immersed in a liquid having a relatively high refractive index, e.g. water, so as to fill a space between the final element of the projection system and the substrate. Immersion liquids may also be applied to other spaces in the lithographic apparatus, for example, between the array of individually controllable elements and the first element of the projection system. Immersion techniques are well known in the art for increasing the numerical aperture of projection systems.

Exemplary Environment

FIG. 1 schematically depicts a lithographic projection apparatus, according to one embodiment of the invention. The apparatus comprises an illumination system (illuminator) IL, an array of individually controllable elements PPM, a substrate table WT for supporting a substrate W, and a projection system ("lens") PL.

Illumination system (illuminator) IL provides a projection beam PB of radiation (e.g., UV radiation).

The array of individually controllable elements PPM (e.g., a programmable mirror array) patterns the projection beam. In one example, the position of the array of individually controllable elements will be fixed relative to projection system PL. In another example, it may instead be connected to a positioning means for accurately positioning it with respect to projection system PL.

As discussed above, the substrate table WT (e.g., a wafer table) supports the substrate W (e.g., a resist-coated wafer). The substrate table WT is also connected to a positioning means PW for accurately positioning the substrate with respect to projection system PL.

The projection system ("lens") PL images a pattern imparted to the projection beam PB by the array of individually controllable elements PPM onto a target portion C (e.g., comprising one or more dies) of the substrate W. In one example, the projection system PL may image the array of individually controllable elements PPM onto the substrate W. In another example, the projection system PL may image secondary sources, for which the elements of the array of individually controllable elements PPM act as shutters. The projection system PL may also comprise an array of focusing elements, such as a micro lens array (known as an MLA) or a Fresnel lens array. This can be done, for example, to form the secondary sources and to image microspots onto the substrate.

In the embodiment shown, the apparatus is of a reflective type (i.e., has a reflective array of individually controllable elements). However, in general, it may also be of a transmissive type, e.g., with a transmissive array of individually controllable elements.

The illuminator IL receives a beam of radiation from a radiation source SO. In one example, the source SO and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD. In this case the beam delivery system BD includes, but is not limited to, suitable directing mirrors and/or a beam expander. In other examples the source SO may be integral part of the apparatus, for example when the source is a mercury lamp. In this example, the source SO and the illuminator IL, together with the beam delivery system BD, if required, may be referred to as a radiation system.

The illuminator IL may comprise adjusting means AM for adjusting the angular intensity distribution of the beam. Generally, at least the outer and/or inner radial extent (commonly referred to as σ-outer and σ-inner, respectively) of the intensity distribution in a pupil plane of the illuminator IL can be adjusted. In some examples the illuminator IL comprises various other components, such as an integrator IN and a condenser CO. The illuminator IL provides a conditioned beam of radiation, referred to as the projection beam PB, having a desired uniformity and intensity distribution in its cross-section.

The beam PB subsequently interacts with the array of individually controllable elements PPM. Having been reflected by the array of individually controllable elements PPM, the beam PB passes through the projection system PL, which focuses the beam PB onto a target portion C of the substrate W.

In one example, with the aid of a positioning means PW, and possibly an interferometric measuring means IF, the substrate table WT can be moved accurately, e.g., so as to position different target portions C in the path of the beam PB.

In one example, a positioning means PW for the array of individually controllable elements PPM can be used to accurately correct the position of the array of individually controllable elements PPM with respect to the path of the beam PB, e.g., during a scan.

In one example, movement of the substrate table WT is realized with the aid of a long-stroke module (course positioning) and a short-stroke module (fine positioning), which are not explicitly depicted in FIG. 1. A similar system may also be used to position the array of individually controllable elements PPM.

It will be appreciated that the projection beam PB may alternatively/additionally be moveable while the substrate table WT and/or the array of individually controllable elements PPM may have a fixed position to provide the required relative movement.

As a further alternative, that may be especially applicable in the manufacture of flat panel displays, the position of the substrate table WT and the projection system PL may be fixed and the substrate W may be arranged to be moved relative to the substrate table WT. For example, the substrate table WT may be provided with a system for scanning the substrate W across it at a substantially constant velocity.

Although the lithography apparatus according to the invention is herein described as being for exposing a resist on a substrate, it will be appreciated that the invention is not limited to this use and the apparatus may be used to project a patterned projection beam for use in resistless lithography.

The depicted apparatus can be used in four one modes: a step mode, a scan mode, a pulse mode, and a continuous scan mode.

In a Step mode, the array of individually controllable elements PPM imparts an entire pattern to the projection beam PB, which is projected onto a target portion C in one pass (i.e., a single static exposure). The substrate table WT is then shifted in the X and/or Y direction, so that a different target portion C can be exposed. In step mode, the maximum size of the exposure field limits the size of the target portion C imaged in a single static exposure.

In Scan mode, the array of individually controllable elements PPM is movable in a given direction (e.g., a "scan direction" or a Y direction) with a speed v, so that the projection beam PB is caused to scan over the array of individually controllable elements PPM. Concurrently, the substrate table WT is substantially simultaneously moved in the same or opposite direction at a speed V=Mv, in which M is the magnification of the lens PL. In scan mode, the maximum size of the exposure field limits the width (in the non-scanning direction) of the target portion C in a single dynamic exposure, whereas the length of the scanning motion determines the height (in the scanning direction) of the target portion C.

In Pulse mode, the array of individually controllable elements PPM is kept essentially stationary and the entire pattern is projected onto a target portion C of the substrate W using a pulsed radiation system. The substrate table WT is moved with an essentially constant speed, such that the projection beam PB is caused to scan a line across the substrate W. The pattern on the array of individually controllable elements PPM is updated as required between pulses of the radiation system. The pulses are timed such that successive target portions C are exposed at the required locations on the substrate W. Consequently, the projection beam PB scans across the substrate W to expose the complete pattern for a strip of the substrate W. The process is repeated until the complete substrate W has been exposed line by line.

Continuous scan mode is essentially the same as pulse mode except that a substantially constant radiation source is used and the pattern on the array of individually controllable elements PM is updated as the projection beam PB scans across the substrate W and exposes it.

Combinations and/or variations on the above described modes of use or entirely different modes of use may also be employed.

Exemplary Array of Individually Controllable Elements

FIG. 2 is a side view of a spatial light modulator, according to one embodiment of the invention. FIG. 2 shows in cross-section an element 10 (e.g., a pixel) of the array of individually controllable elements PPM (e.g., a spatial light modulator). Each pixel 10 comprises a mirror 11 pivotable about axle 12, which forms the beam modulating element of pixel 10, mounted above a substrate 16. Supports (not shown) for axle 12 are omitted from the view for clarity. To control the pivoting of mirror 11, capacitor plates 13 are provided on substrate 16, one under each half of mirror 11. Corresponding plates (not shown) are provided on a back side of mirror 11 though these may be omitted if mirror 11 itself is sufficiently conductive. The incident projection beam PB is reflected in different directions by mirrors 11 in a rest state and in an activated state. Other activation means could also be employed, as would become apparent to one of ordinary skill in the art In one example, a suitable spatial filter (not shown) is used to block radiation reflected by mirrors 11 in one of these two states so that the deformable mirror 11 becomes a switch. It is to be appreciated that more complex arrangements can be used to effect grayscales.

In one example, to set the spatial light modulator PPM to display the desired pattern, each pixel 10 must be individually addressed. This is accomplished by pixel control circuits 15 on a rear side of substrate 16. Control circuit 15 for each pixel 10 is connected to respective capacitor plates 13 by vias 14. Vias 14 may be made, at an early stage in formation of the device, by etching aligned holes or trenches half way through substrate 16 from each side and depositing a metal layer on the walls of vias 14. Limited numbers of vias are shown to simplify the view.

Figure 4:
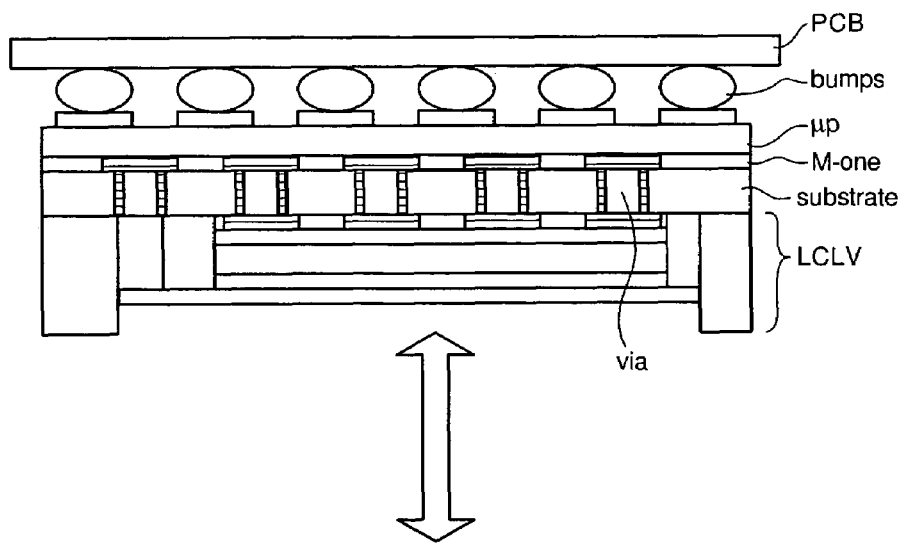
FIG. 4 depicts a liquid crystal light valve integrated on a substrate with a microprocessor.

FIG. 4 is a plan view of addressing circuits 20 that can be used in the environment of FIGS. 1 and 2, shown from a rear of the spatial light modulator PPM. A liquid crystal light valve (LCLV) with a microprocessor (μp) is integrated on substrate 16. A primary interface 21 receives the pattern data from an external source (not shown) and distributes the data to respective column address lines 22 that connect to respective pixels 10 and deliver the respective pattern data to each the control circuits 15.

In one example, to maximize the rate at which data can be transferred to the spatial light modulator PPM, it is delivered optically and using a plurality of channels, for example one per column of pixels 10. In this example, primary interface 21 comprises a plurality of optical fiber inputs to couple to respective optical fibers and convert the optical signal to an electronic signal. Such conversion is known in the art. Also included in the primary interface 21 and/or pixel control circuits 15 are one or more of the following: (1) one or more analog to digital (A/D) converters; (2) one or more digital to analog (D/A) converters; and (3) one or more CPUs. In this example, these components allow compressed data to be sent to the spatial light modulator PPM and auto calibration of each pixel 10.

In one example, mirrors 11 are driven to effect grayscale exposures by analog control signals, while the data is delivered to the spatial light modulator PPM in compressed digital form. In various examples, the CPU(s): (1) decompress the digital data, (2) deliver the digital data in sequence to the digital to analog converters; and/or (3) control multiplexers that deliver the analog control signals to the respective pixels 10.

In one example, internal calibration of the digital to analog converters can be performed using an analog to digital converter as a reference. The mirror tilt can be calibrated by applying a specified DC voltage to the capacitor plate 13 underneath mirror 11 and measuring the resulting capacitance by measuring the current that flows when a small AC component is added to the capacitor potential. The measured capacitance indicates the mirror position. Measuring the resonant frequency of each mirror 11 gives information about the aging of the mirror hinges.

All of the data resulting from the above calibrations may be retained by the on-board CPUs of the spatial light modulator so that the necessary corrections can be applied transparently to control circuit 15. Alternatively, the data can be communicated to control circuit to effect the necessary corrections in the data delivered to the SLM.

Conclusion

While specific embodiments of the invention have been described above, it will be appreciated that the invention may be practiced otherwise than as described. The description is not intended to limit the invention.

What is claimed is:

1. A spatial light modulator, comprising:
   an array of pixels disposed on a support, each pixel in the array of pixels having a light modulating element that modulates an incident radiation beam;
   an optical input device that receives an optical control signal including pattern data and generates a control signal therefrom; and
   a control circuit that receives the control signal and positions the modulating elements according to the received control signal,
   wherein said control circuit comprises:
      a digital-to-to analog converter,
      an analog-to-digital converter,
      an optical-to-electrical converter, and
      a plurality of processors, and wherein the control circuit is coupled to an opposite side of the support than the light modulating element.

2. The spatial light modulator of claim 1, wherein at least one of the optical input device and said control circuit decompresses the pattern data.

3. The spatial light modulator of claim 1, wherein said control circuit calibrates each of the pixels of the array of pixels.

4. A lithographic projection apparatus, comprising:
a radiation system that provides a projection beam of radiation;
an array of pixels disposed on a support, each pixel in the array of pixels having a light modulating element that modulates the projection beam;
an optical input device that receives an optical control signal including pattern data and generates a control signal therefrom;
a control circuit that receives the control signal and positions the modulating elements according to the received control signal; and
a projection system that projects the patterned beam onto a target portion of a substrate,
wherein said control circuit comprises:
a digital-to-analog converter,
an analog-to-digital converter,
an optical-to-electrical converter, and
a plurality of processors, and
wherein the control circuit is coupled to an opposite side of the support than the light modulating element.

5. The lithographic projection apparatus of claim 4, wherein at least one of the optical input device and said control circuit decompresses the pattern data.

6. The lithographic projection apparatus claim 4, wherein said control circuit calibrates each of the pixels of the array of pixels.

7. A device manufacturing method, comprising:
converting a received optical control signal to an electrical control signal using a control circuit comprising.
a digital-to-analog converter,
an analog-to-digital converter,
an optical-to-electrical converter, and
a processor;
providing the electrical control signal to an array of pixels having light modulating elements, the array of pixels being disposed on a support such that the control circuit is coupled to an opposite side of the support than the array of pixels;
positioning each light modulating element of each pixel in an array of pixels based on the electrical signal;
patterning a projection beam of radiation using the array of pixels; and
projecting the patterned beam onto a target portion of a substrate.

8. The method of claim 7, further comprising decompressing compressed pattern data located within the optical control signal.

9. The method of claim 7, further comprising calibrating each of the pixels of the array of pixels.

* * * * *

UNITED STATES PATENT AND TRADEMARK OFFICE
CERTIFICATE OF CORRECTION

PATENT NO.        : 7,154,587 B2                                      Page 1 of 1
APPLICATION NO.   : 10/875616
DATED             : December 26, 2006
INVENTOR(S)       : Arno Jan Bleeker It is certified that error appears in the above-identified patent and that said Letters Patent is hereby corrected as shown below:

<u>Column 10 Claim 7</u>
Line 7 please replace "comprising." with --comprising,--.

Signed and Sealed this

Thirteenth Day of March, 2007

JON W. DUDAS
*Director of the United States Patent and Trademark Office*